United States Patent [19]

Salina et al.

[11] Patent Number: 4,816,702

[45] Date of Patent: Mar. 28, 1989

[54] CMOS LOGIC CIRCUIT

[75] Inventors: Alberto Salina, Limbiate; Domenico Rossi, Cilavegna; Claudio Diazzi, Milan, all of Italy

[73] Assignee: SGS Microelettronica S.p.A., Catania, Italy

[21] Appl. No.: 130,705

[22] Filed: Dec. 9, 1987

[30] Foreign Application Priority Data

Dec. 10, 1986 [IT] Italy .............................. 83669 A/86

[51] Int. Cl.⁴ ................. H03K 19/092; H03K 19/096; H03K 3/29; H03K 3/26
[52] U.S. Cl. .................................... 307/475; 307/291; 307/272.2; 307/279; 307/480; 307/481
[58] Field of Search ............... 307/475, 443, 290, 291, 307/292, 279, 271.1, 271.2, 273, 480, 481

[56] References Cited

U.S. PATENT DOCUMENTS

| | | | |
|---|---|---|---|
| 3,984,703 | 10/1976 | Jorgensen | 307/290 |
| 4,110,641 | 8/1978 | Payne | 307/355 |
| 4,495,629 | 1/1985 | Fasio et al. | 307/272.2 |
| 4,703,200 | 10/1987 | Zangara | 307/451 |

FOREIGN PATENT DOCUMENTS 3443798  6/1986  Fed. Rep. of Germany ...... 307/279

OTHER PUBLICATIONS

CMOS Integrated Circuits, National Semiconductor Corp., 1975, pp. 229–241.
Fink et al, Electronics Engineers' Handbook, McGraw Hill, 1975, pp. 16.42 to 16.49.
Horowitz et al, The Art of Electronics, Cambridge University Press, 1980, pp. 162, 384–387.

Primary Examiner—John S. Heyman
Assistant Examiner—Trong Quang Phan
Attorney, Agent, or Firm—Pollock, Vande Sande & Priddy

[57] ABSTRACT

A CMOS logic circuit for sampling data coming from TTL logic circuits under frequency control by a system's clock intrinsically faster than prior art similar circuits is obtained by combining a TTL/CMOS compatibility interface inverting stage with a first stage of the sampling circuit (master or latch stage). The circuit of the invention permits elimination of two inverters and therefore reduction of data transfer delay.

6 Claims, 2 Drawing Sheets

CMOS LOGIC CIRCUIT

BACKGROUND OF THE INVENTION

1. Field of the Invention

The present invention relates, in general, to socalled micrologic circuits, that is logic circuits made by the integrated circuit technique "condensing" a large number of basic and complex logic functions (logic circuitry) into a single monolithically integrated semiconductor device, according to LSI (Large Scale Integration) of VLSI (Very Large Scale Integration) techniques. According to such techniques a large number of logic elements, including complex ones such as binary decase counters, shiftregister, etc., may be implemented onto a single chip.

More in particular, the invention relates to CMOS logic circuit, i.e. integrated circuits made by the socalled complementary MOS (Metal Oxide Semiconductor) technology, utilizing P-channel and N-channel superficial field effect transistors.

CMOS circuits have the great advantage of dissipating "power" only during transition of internal and input and/or output electrical signals. In other words, if DC levels are applied to a CMOS circuit, the circuit, even though correctly supplied, shows a current absorption (defined as $I_{CC}$ =quiescent supply current or rest current) which is equal only to the leakage current of internal junctions of the reverse biased circuit. For SSI (Short Scale Integration) and MSI (Medium Scale Integration) CMOS circuits, i.e. with a total number of transistors which may reach about 500, the $I_{CC}$ current, under rest conditions, i.e. under static conditions of the signals applied to the inputs (with logic levels of 0 or 1 satisfying the limits of the logic levels $V_{IL}$ and $V_{IH}$) is in the order of $$I_{CC} = 10^{-6} A = 1 \mu A$$

In more densly packed integrated CMOS circuits of modern LSI or VLSI technologies, such a value may even be reduced by two or three orders of magnitude at room temperature so that the stand-by current, or quiescent current, is only fire nanoamperes (nA). As it is easily appreciated, such characteristic makes the CMOS micro-logics extremely advantageous with respect to other families of micrologics and particularly with respect to the one which, because of its extraordinary high speed characteristics, has dominated the field of standard logics (basic logic functions constituting the "connecting tissue" or "binder" for aggregating over complex cards LSI or VLSI integrated micrologic devices): that is, the TTL family (Transistor-Transistor Logic). Such TTL micrologics have in fact the disadvantage of a quiescent current which may vary between few hundreds of microamperes ($\mu A$) to few milliamperes (mA).

On the other hand, today many apparatus and/or logic devices made by the CMOS technology are often designed so as to be interfaceable with the output of TTL logic gates. In these instances, the CMOS circuitry is also known as HCT micrologics (from High Speed CMOS, TTL Compatible). In these situations the gate, i.e. the input stage of the HCT logic, must be capable of accepting and discriminating the worst output levels available from a TTL logic output gate, that is:

1 (TTL logic) equivalent to $V_{OHTTLmin} = 2.4$ V
0 (TTL logic) equivalent to $V_{OLTTLmax} = 0.4$ V with a sufficient noise immunity, so that:
$V_{INHmin} = 2.0$ V and $V_{INLmax} = 0.8$ V.

Under these conditions, the triggering threshold voltage for which the input stage of the CMOS logic circuit is designed equals to:

$$(2.0 + 0.8)/2 = 1.4 \text{ V}$$

This is obtained in practice by providing a suitable input interface stage in order to ensure the necessary compatibility among signals coming from TTL circuits and the CMOS circuitry.

In order to avoid problems of erratic transitions at the equilibrium of the inputs, a voltage hysteresis is implemented in order to force an unbalance of the input reference voltages.

Furthermore in many applications, data coming from TTL logics are samples and stored within the CMOS circuitry under frequency control by a system clock. That is, the TTL logic data are sampled in accordance with the clock pulses of a system clock.

2. Discussion of the Prior Art

According to the prior art, at an input of a CMOS logic circuit these two typical functions are implemented by recourse to a first interface stage for ensuring, as already mentioned, triggering threshold value compatibility (TTL/CMOS), followed by a phase inverting stage (inverter) (IN.) for resetting the correct phase of the signal. The latter is then presented to the input of a first stage ("master" stage) of a double stage "master-slave" memory circuit, e.g. a JK flip-flop.

The input gate of the "master" stage, as well as the transfer gate to the "slave" stage, are controlled by a system's clock through suitable switches.

Such an input circuit of a CMOS circuitry may be represented by the diagram of FIG. 1; the "master" and "slave" stages being identified by the respective dash-line squares, M for the "master" stage and S for the "slave" stage.

A clock signal drives the switches SW in a synchronous mode and in phase opposition among them according to the following scheme:
SW1: ON
SW2: OFF
SW1': OFF
SW2': ON
and vice versa.

The operation of such a circuit is well known. Typically, with the descending front (leading edge) of the clock signal, the output data is acquired by the first stage (M) (i.e. SW1 ON; SW2 OFF; SW1' OFF and SW2' ON) and with the subsequent raising front (or trailing edge) of the clock signal, the data is transferred to, and memorized by, the second stage (S) (i.e. SW1 OFF; SW2 ON; SW1' ON and SW2' OFF).

The most commonly used circuits for implementing a TTL/CMOS input interface stage are:

a Schmidt trigger with triggering threshold between the maximum voltage relative to the low logic state (0) and the minimum voltage relative to the high logic state (1); or a comparator circuit with a definite hysteresis capable of allowing the input voltage to drop to the $V_{SS}$ value.

The circuit diagram of a CMOS Schmidt trigger is shown in FIG. 2.

A CMOS hysteresis comparator circuit wherein the input voltage may drop to the $V_{SS}$ voltage, is shown by the circuit diagram of FIG. 3.

In any case, by taking into consideration the time behavior of the CMOS input circuit (which may be identified as terminating at the output of the "master" stage), it may be observed that the data presented to the CMOS input circuit will be present at the output of the M stage after a certain period of time corresponding to the sum of the delays introduced by the various stages. This time behavior of the input circuit is indicated by the diagram of FIG. 4.

Clearly the delay introduced is given by:

$$t = t1 + t2 + t3 - t4$$

where:
t1 is the delay introduced by the compatibility interface stage TTL/CMOS;
t2 is the delay introduced by the inverter (IN) for resetting the correct phase of the signal;
t3 is the delay introduced by the switch SW1; and
t4 is the delay introduced by the inverter IN1.

Such delays pose naturally limitations to the performance of the circuit in so as the minimum duration of the data (signal) at the input must be greater than the sum of t1+t2+t3 with obvious negative reflections on the transfer speed of data within the CMOS circuit.

DESCRIPTION OF THE INVENTION

A main object of the present invention is to reduce the delay introduced by an input interface circuit of CMOS logic circuitry.

This objective and other advantages are obtained by means of the CMOS circuit of the present invention.

According to this invention, the recourse to TTL/CMOS compatibility interface stages and distinct phase inverting stages placed before the input of a master (M) stage (or of a generic "latch" stage) is no longer necessary. This is achieved by modifying such a master or "latch" stage so as to utilize as an inverting stage for the acquisition of the data a TTL/CMOS compatibility interface stage, i.e. by "combining" the two functions of rendering the CMOS circuit compatible to the signals coming from TTL logics, and the sampling of the input data under the frequency control exercised by the system clock, i.e. each pulse of the system clock represents a discrete time period during which a certain action may occur. This allows reduction of the delay introduced by such a CMOS input circuit to the sum of only the delays of a switch and of a single TTL/CMOS compatibility inverting stage.

Therefore the CMOS logic circuit for sampling data in the form of logic states "0" and "1", coming from TTL logic circuits, under frequency control by a system's clock, comprises:

a first switch between an input terminal of the circuit and the input of a TTL/CMOS compatibility interface stage;

the output of said TTL/CMOS interface stage being connected, through a phase inverting stage (inverter) followed by a second switch, to the input of said TTL/CMOS interface stage;

said first and second switches being driven syncronously and in phase opposition by a clock's signal.

Figure 5:
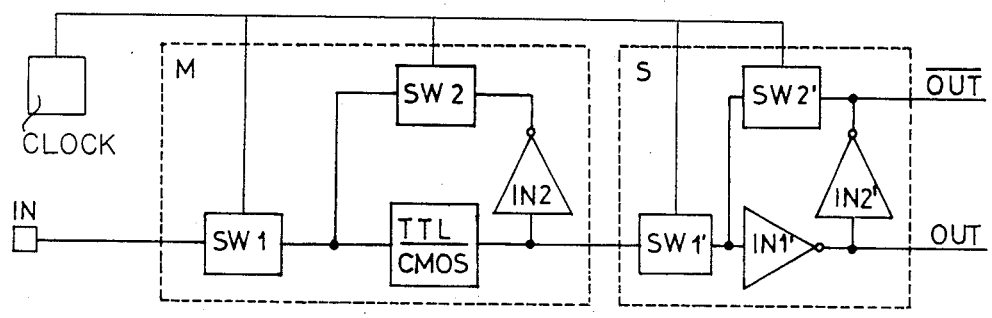
FIG. 5 is a schematic diagram of the present invention circuit.

Essentially the circuit of the invention may be illustrated schematically by the diagram of FIG. 5.

Figure 2:
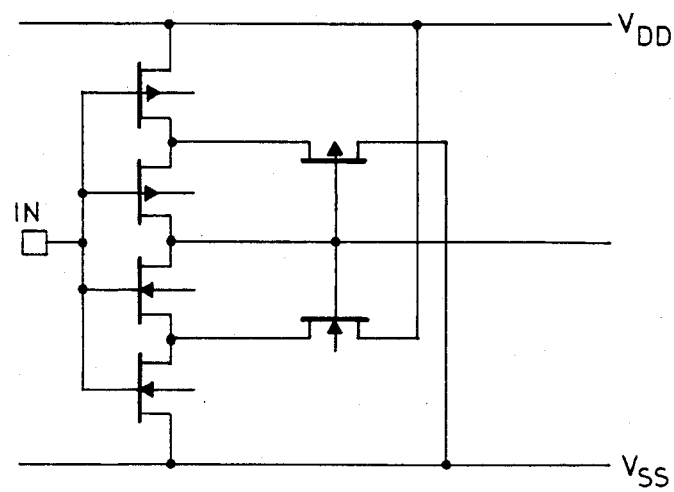
FIG. 2 is a circuit diagram of a CMOS Schmidt trigger.
Figure 3:
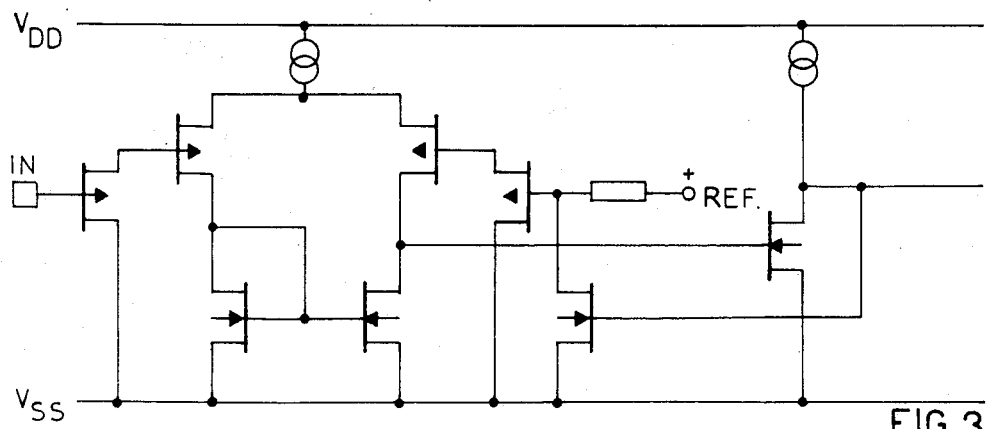
FIG. 3 shows a CMOS hysteresis comparator circuit whose input voltage may drop to the $V_{ss}$ voltage.
Figure 4:
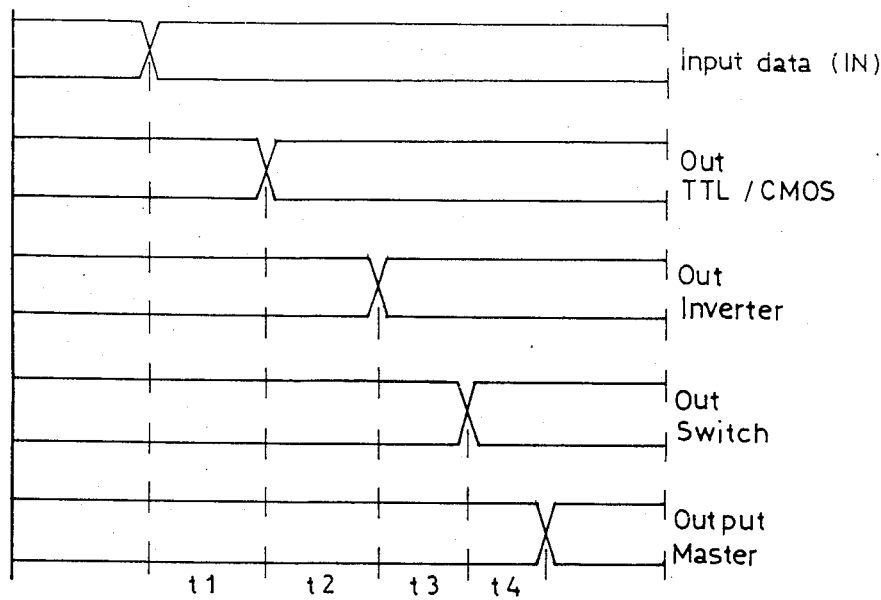
FIG. 4 is a timing diagram of the CMOS input circuit through its various stages.

The TTL/CMOS compatibility inverting interface stage may be any one of the known circuits notably used for this purpose according to the prior art. According to a preferred embodiment, such a compatibility stage is a Schmidt trigger of the type shown in FIG. 2. According to another preferred embodiment, the TTL/CMOS compatibility stage is a hysteresis comparator circuit of the type shown in FIG. 3.

Figure 1:
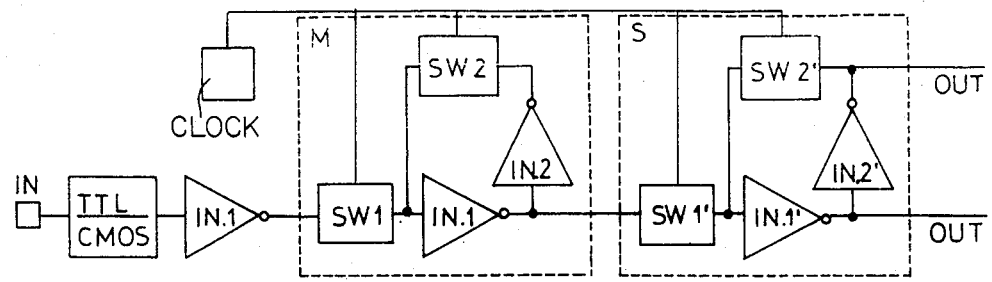
FIG. 1 is a schematic diagram of a prior art master-slave circuit.

Overall, as it is easily observed by comparing the block diagram of a prior art circuit, as shown in FIG. 1, and the block diagram of a circuit in accordance with the present invention, as shown in FIG. 5, the present invention permits elimination of two inverters.

Figure 6:
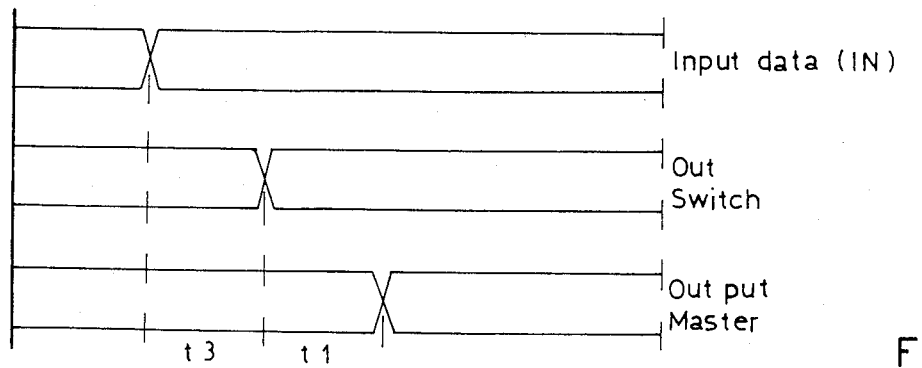
FIG. 6 is a timing diagram of the FIG. 5 circuit.

The time behavior diagram of the circuit of the invention is shown in FIG. 6, from which it is observed that the delay introduced by the data sampling CMOS logic circuit, i.e. referred to the output of the first master stage, is given by the sum of only the delays t3 and t1, atrributable to the switch SW1 and to the TTL/CMOS compatibility inverting stage, respectively.

The advantages procured by the circuit of the invention are evident. All other conditions, such as the fabrication technology, being equal, the circuit of the invention introduces a decisively smaller delay in respect to the known circuits. Moreover, the use of the circuit of the invention in place of the known circuits allows a reduced area requirement for the whole CMOS input stage.

As it will be evident to the skilled technician, the circuit of the invention may be used in various circuit applications different from the one described in the example of the figures, which represents substantially the application of the invention to a CMOS master-slave stage. For instance, the circuit of the invention may be used in flip-flops with multiple inputs, as a latch memory element and for other purposes yet.

What we claim is:

1. In a CMOS circuit having a logic circuit for directly sampling data transmitted from TTL logic circuits under frequency control of a system clock, the data having logic states of "0" and "1," the logic circuit comprising:

a first switch for accepting the data;
a TTL/CMOS compatibility interface stage having an input connected to the output of the first switch;
an inverter stage having an input connected to the output of the TTL/CMOS compatibility interface stage;
a second switch having an input connected to the output of the inverter stage, the output of the second switch being connected to the input of the TTL/CMOS compatibility interface stage to effect a feedback for the TTL/CMOS compatibility interface stage;

wherein the first and second switches are controlled synchronously and in opposite phases in accordance with clock pulses generated by the clock to remove the need to have an input interface circuit connected thereto in order to sample data transmitted from the TTL logic circuits;

whereby time delays introduced by the input interface circuit are eliminated.

2. The logic circuit according to claim 1 wherein the TTL/CMOS compatibility interface stage is a Schmidt trigger circuit; and wherein the inverter stage connected to the TTL/CMOS compatibility interface stage is used to reset the phase of signals outputted from the TTL/CMOS compatibility interface stage.

3. The logic circuit according to claim 1, wherein the TTL/CMOS compatibility interface stage is a hysteresis comparator circuit; and wherein the inventer stage connected to the TTL/CMOS compatibility interface stage is used to reset the phase of signals outputted from the TTL/CMOS compatibility interface stage.

4. The logic circuit according to claim 1, further comprising:
- a third switch having an input connected to the output of the TTL/CMOS compatibility interface stage;
- a second inverter stage having an input connected to the output of the third switch;
- wherein the output of the second inverter stage is connected to its own input through a third inverter stage and a fourth switch; and
- wherein the third and fourth switches are controlled synchronously and in opposite phases, and with respect to the first and second switches, by the generated clock pulses.

5. The logic circuit according to claim 2, further comprising:
- a third switch having an input connected to the output of the TTL/CMOS compatibility interface stage;
- a second inverter stage having an input connected to the output of the third switch;
- wherein the output of the second inverter stage is connected to its own input through a third inverter stage and a fourth switch; and
- wherein the third and fourth switches are controlled synchronously and in opposite phases, and with respect to the first and second switches, by the generated clock pulses.

6. The logic circuit according to claim 3, further comprising:
- a third switch having an input connected to the output of the TTL/CMOS compatibility interface stage;
- a second inverter stage having an input connected to the output of the third switch;
- wherein the output of the second inverter stage is connected to its own input through a third inverter stage and a fourth switch; and
- wherein the third and fourth switches are controlled synchronously and in opposite phases, and with respect to the first and second switches, by the generated clock pulses.

* * * * *